United States Patent
Park et al.

(10) Patent No.: US 11,886,788 B2
(45) Date of Patent: Jan. 30, 2024

(54) DUPLICATE CIRCUIT SECTION IDENTIFICATION AND PROCESSING FOR OPTICAL PROXIMITY CORRECTION (OPC) PROCESSES IN ELECTRONIC DESIGN AUTOMATION (EDA) APPLICATIONS

(71) Applicant: Siemens Industry Software Inc., Plano, TX (US)

(72) Inventors: Jea Woo Park, Tualatin, OR (US); Soohong Kim, Pleasanton, CA (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/212,074

(22) Filed: Mar. 25, 2021

(65) Prior Publication Data

US 2022/0309220 A1    Sep. 29, 2022

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
CPC .... G06F 30/398; G06F 30/39; G06F 2119/18; G06F 30/392; G06F 2111/20; G06F 2119/02; G06F 30/27; G06F 16/164; G06F 16/1744; G06F 2119/06; G06F 30/327; G06F 30/34; G06F 30/36; G06F 7/5443; G06F 16/51; G06F 16/5854; G06F 17/18; G06F 2111/08; G06F 30/20; G06F 30/30; G06F 30/33; G06F 30/394; G06F 30/323; G06F 2119/12; G06F 30/396;
(Continued)

(56) References Cited

U.S. PATENT DOCUMENTS 7,386,433 B2   6/2008  MacLean et al.
11,003,828 B1  5/2021  Mousa et al.
(Continued)

FOREIGN PATENT DOCUMENTS

EP    1431820    6/2004

OTHER PUBLICATIONS

Koranne Sandeep: "Deja Vu: An Entropy Reduced Hash Function for VLSI Layout Databases" ; IEEE Transactions on Computer-Aided Design of Integrated Circuits and Systems, IEEE; USA,; vol. 34; No. 11; Nov. 1, 2015; pp. 1798-1807M; XP011587141; ISSN: 0278-0070; DOI: 10.1109/TCAD.2015.2432132, 10 pages.

*Primary Examiner* — Binh C Tat (57) ABSTRACT

A computing system may include a circuit design access engine configured to access a circuit design. The computing system may also include a duplicate section processing engine configured to partition the circuit design into multiple circuit sections and determine, from among the multiple circuit sections, an identical section set based on duplicate criteria. Circuit sections of the identical section set may satisfy the duplicate criteria with respect to one another. The duplicate section processing engine may further be configured to perform an OPC processing operation on a selected circuit section of the identical section set and apply an OPC result of the performed OPC processing operation for other circuit sections of the identical section set instead of or without performing the OPC processing operation on the other circuit sections of the identical section set.

20 Claims, 6 Drawing Sheets

(58) Field of Classification Search
CPC ............... G06F 30/337; G06F 2115/06; G06F 30/3315; G06F 2110/10; G06F 2119/08; G06F 30/367; G06F 30/373; G06F 30/3947; G06F 30/3308; G06F 11/324; G06F 18/23; G06F 18/24; G06F 2119/22; G06F 30/23; G06F 30/31; G06F 2113/04; G06F 2117/10; G06F 30/3323; G06F 30/3953; G03F 1/36; G03F 1/70; G03F 7/705; G03F 1/76; G03F 7/70441; G03F 7/70508; G03F 1/68; G03F 7/70433; G03F 7/70291; G03F 7/70125; G03F 1/78; G03F 7/70625; G03F 1/84; G03F 7/70133; G03F 7/70258; G03F 7/70425; G03F 7/70525; G03F 7/70616; G03F 1/44; G03F 7/0002; G03F 7/0005; G03F 7/70466; G03F 7/70558; G03F 7/70633; G03F 7/7065; G03F 7/7085; G03F 1/72; G03F 7/70283; G03F 7/70783; H01L 27/0207; H01L 21/0277; H01L 27/11803; H01L 21/0274; H01L 23/5283; H01L 2027/11875; H01L 23/5386; H01L 21/0337

USPC .................................................. 716/100–106

See application file for complete search history.

(56) References Cited

U.S. PATENT DOCUMENTS

| 2013/0198699 | A1* | 8/2013 | Simmons | G03F 1/36 716/53 |
| 2019/0166311 | A1* | 5/2019 | Sugaya | H04N 21/4728 |
| 2020/0019052 | A1* | 1/2020 | Swanson | G03F 1/70 |

* cited by examiner

DUPLICATE CIRCUIT SECTION IDENTIFICATION AND PROCESSING FOR OPTICAL PROXIMITY CORRECTION (OPC) PROCESSES IN ELECTRONIC DESIGN AUTOMATION (EDA) APPLICATIONS

BACKGROUND

Electronic circuits are used in nearly every facet of modern society, from automobiles to microwaves to personal computers. Design of circuits may involve many steps, known as a "design flow." The particular steps of a design flow are often dependent upon the type of circuit being designed, its complexity, the design team, and the circuit fabricator or foundry that will manufacture the circuit. Electronic design automation (EDA) applications support the design and verification of circuits prior to fabrication. EDA applications may implement various functions, tools, capabilities, or features to test or verify a circuit design at various stages of the design flow.

BRIEF DESCRIPTION OF THE DRAWINGS

Certain examples are described in the following detailed description and in reference to the drawings.

DETAILED DESCRIPTION

The following disclosure relates to EDA applications which may be used to facilitate the design and manufacture of circuits. As technology improves, modern circuit designs may include billions of components, often times more. To support increasing degrees of circuit design complexity, EDA applications may include various features such as high-level synthesis, schematic capture, transistor or logic simulation, field solvers, functional and physical verifications, geometry processing, equivalence checking, design rule checks, OPC or lithography simulations, mask data preparation, and more.

Execution of EDA applications and processes may require significant computational resources, and how particular EDA computing environments are implemented may vary between different entities that use EDA applications for circuit design and verification. Distributed computing environments configured to execute EDA processes across multiple different computing devices may range from 16 central processing unit (CPU) configurations, to 10,000 of CPUs, to more. As circuit designs continue to increase in complexity, computational requirements of EDA applications may continue to increase. As such, improvements in the computational performance and capability of computing systems used to execute EDA applications may provide significant technical benefits.

OPC processes may be one area of EDA design flows with increasing computational requirements. OPC processes may refer to any OPC execution sequence, OPC application capability, or other OPC-related feature that an EDA application can perform, implement, or execute. Aspects of OPC processes can include geometry processing, lithography simulations (also referred to herein as OPC simulations), and more. Execution of modern OPC processes may be incredibly complex and can often involve large-scale parallel processing systems using a distributed network of individual computing devices. Since geometry processing, lithography simulations, and various other execution flows of an OPC process can require immense computational resources, improvements in OPC executions can yield benefits in the performance, speed, and efficiency of EDA computing systems.

One technique to improve the execution latency of OPC processes is to flatten circuit designs. By doing so, operational dependencies inherent in circuit design hierarchies can be removed, and OPC operations can be scheduled with increased parallelism and efficiency. By processing flattened circuits on a per-section basis, higher scalability and parallelism can be achieved, which may result in performance improvements for the execution of OPC processes or various other EDA processes. Example features of section-based processing are described in U.S. patent application Ser. No. 16/282,562, titled "SECTION-BASED PROCESSING OF POST TAPE OUT FLOWS" and with first-named inventor Soohong Kim, the entire contents of which are incorporated by reference herein. Trade-offs may be pertinent to circuit flattening techniques, including for flattening-in-part techniques in which some, but not all, design hierarchies of a circuit design are flattened. One trade-off is that some hierarchy information of repeating design cells can be lost, and each individual section of a partitioned circuit design may be processed separately without the benefit of repeating design structures or common design elements.

The features described herein may support duplicate section identification and processing for OPC processes in EDA applications. The duplicate section technology described herein can identify duplicate circuit sections in partitioned circuit designs, and may do so for flattened circuit designs that include a lesser degree of hierarchy data as compared to conventional hierarchical circuit designs. Moreover, the duplicate section technology of the present disclosure may support identification and processing of duplicate circuit sections independent (e.g., regardless) of whether an input circuit design has any stored hierarchical data at all. As such, the duplicate section technology described herein can be implemented or performed without any reference to unit cells or design hierarchies of a circuit design, and may thus be widely applicable to any type of circuit design, whether flattened, flattened-in-part, or unflattened.

In particular, the duplicate section technology described herein may support identification of duplicate sections through any number of duplicate criteria. The duplicate criteria provided herein may support determination of duplicate sections in a partitioned circuit design based on characterizations or evaluations of individual circuit sections, whether through polygon hashing, pattern matching, image processing, or various other techniques as described herein. Through identification of duplicate sections in a partitioned circuit design, OPC processing results for a representative circuit section may be applied to other circuit sections that satisfy the duplicate criteria with respect to the representative circuit section. Such application of OPC processing results to multiple circuit sections can improve parallelism, scalability, and performance of EDA computing systems performing OPC processes on the partitioned circuit design. Moreover, the duplicate criteria may be applied without reference to, independent of, or without reliance upon the hierarchy of a circuit design (e.g., without reference or dependence on any repeating unit cell that forms the circuit design). As such, the duplicate section technology described herein can provide computing system improvements without the need to expend additional computational, network, or time resources to tune partitioning parameters or otherwise process complex circuit designs for identical section determinations.

These and other technical benefits of duplicate section features according to the present disclosure are described herein.

Figure 1:
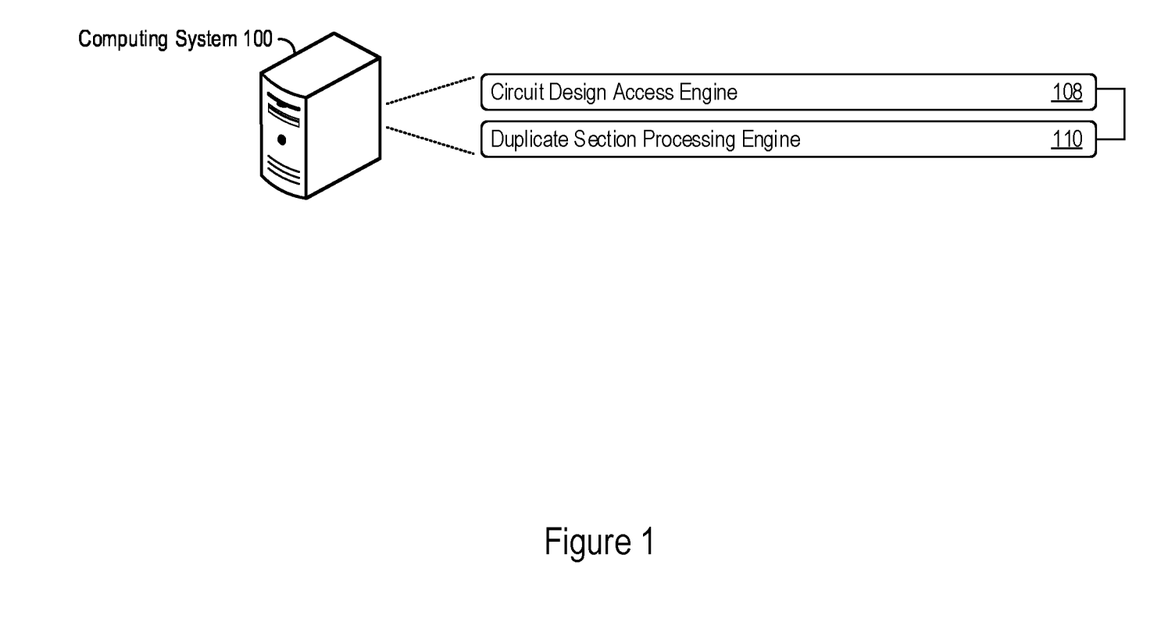
FIG. 1 shows an example of a computing system that supports duplicate circuit section identification and processing for optical proximity correction (OPC) processes in EDA applications.

FIG. 1 shows an example of a computing system 100 that supports duplicate circuit section identification and processing for optical proximity correction OPC processes in EDA applications. The computing system 100 may take the form of a single or multiple computing devices such as application servers, compute nodes, desktop or laptop computers, smart phones or other mobile devices, tablet devices, embedded controllers, and more. In some implementations, the computing system 100 may be an EDA computing system that implements, supports, or hosts an EDA application that can perform or execute any number of EDA-related capabilities and processes, including the identification and processing of duplicate circuit sections in partitioned circuit designs.

To support any of the duplicate section features described herein, the computing system 100 may implement a circuit design access engine 108 and a duplicate section processing engine 110. The computing system 100 may implement the engines 108 and 110 (and components thereof) in various ways, for example as hardware and programming. The programming for the engines 108 and 110 may take the form of processor-executable instructions stored on a non-transitory machine-readable storage medium and the hardware for the engines 108 and 110 may include a processor to execute those instructions. A processor may take the form of single processor or multi-processor systems, and in some examples, the computing system 100 implements multiple engine components or device elements using the same computing system features or hardware components (e.g., a common processor or common storage medium for the engines 108 and 110 as well as any other elements, logic, or capabilities of the computing system).

In operation, the circuit design access engine 108 may access a circuit design. In operation, the duplicate section processing engine 110 may partition the circuit design into multiple circuit sections and determine, from among the multiple circuit sections, identical section sets based on duplicate criteria. Circuit sections of the same identical section set may satisfy the duplicate criteria with respect to one another. In operation, the duplicate section processing engine 110 may further perform an OPC processing operation on a selected circuit section of a particular identical section set and apply an OPC result of the performed OPC processing operation for other circuit sections of the particular identical section set, for example doing so instead of (e.g., without) performing the OPC processing operation on the other circuit sections of the identical section set.

These and other duplicate section features are described in greater detail next. Many of the examples provided herein are described in the context of OPC processing, however the disclosure is not so limited. The duplicate section technology described herein may be applied to any type of EDA processing to identify duplicate circuit sections of partitioned circuit designs and process duplicate circuit sections accordingly.

Figure 2:
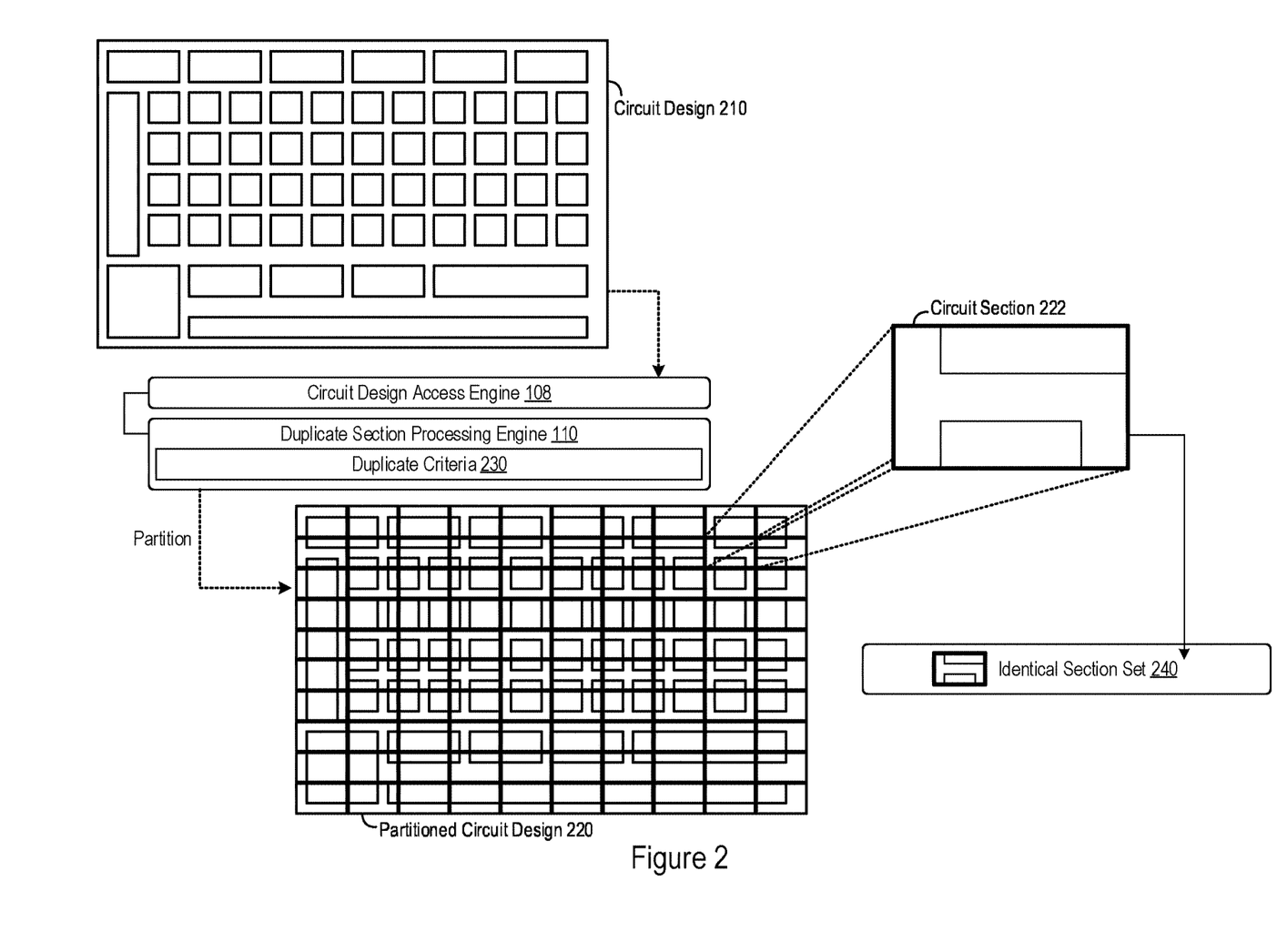
FIG. 2 shows an example determination of identical section sets for a circuit design according to the present disclosure.

FIG. 2 shows an example determination of identical section sets for a circuit design according to the present disclosure. In the example shown in FIG. 2, the circuit design access engine 108 accesses a circuit design 210. The circuit design access engine 108 may do so in any number of ways, for example loading the circuit design 210 from an application memory, receiving the circuit design 210 from another EDA application component or processing step, or retrieving the circuit design 210 in response to a user action.

The circuit design 210 accessed by the circuit design access engine 108 may be represented in any digital design format and may digitally represent any portion or sub-portion of an overall IC design. For instance, the circuit design 210 may be a particular layer of an IC design, and may represent the layer as a physical layout. In some implementations, the circuit design 210 may be flattened such that hierarchical cells are flattened into actual circuit design elements, at least to a threshold degree of hierarchy flattening. In some cases, the circuit design 210 may be entirely flattened such that no hierarchy data is retained in the circuit design 210, and the circuit design 210 includes an entire layout of a circuit layer or circuit sub-portion. In such cases, the circuit design 210 may be in the form of a physical layout with flattened physical circuit elements represented through polygons, which may then be analyzed or processed as part of OPC processing technology provided by an EDA application.

The duplicate section processing engine 110 may partition the circuit design 210 into multiple circuit sections. In doing so, the duplicate section processing engine 110 divide the circuit design 210 according to any number of partitioning parameters, which may specify any aspect of how circuit sections are formed through the partitioning process. For example, the partitioning parameters may specify circuit section dimensions for the partitioning process, and illustrative examples of such dimensions may be a 15 micrometer (μm)×15 μm dimension, a 40 μm×50 μm dimension, or any other configurable dimension for partitioned circuit sections. The partitioning parameters may specify a regular partitioning process, such that all (or as many as possible) circuit sections are partitioned into circuit sections of equal size and dimensions. Additionally or alternatively, the partitioning parameters may specify a starting point in the circuit design 210 from which the partitioning process initiates, e.g., an upper-left point in the circuit design 210, an origin (0,0) point in a circuit coordinate system in which the circuit design 210 is represented, or any other configurable point. Partitioning parameters may be predetermined, flexible, or configurable, and the duplicate section processing engine 110 may partition the circuit design 210 in any number of ways based on specifically-applied partitioning parameters.

In the example shown in FIG. 2, the duplicate section processing engine 110 partitions the circuit design 210 to form the partitioned circuit design 220. The partitioned circuit design 220 may include multiple circuit sections formed through the partitioning process, and individual circuit sections of the partitioned circuit design 220 may include distinct portions of the circuit design 210. An example circuit section of the partitioned circuit design 220 is labeled in FIG. 2 as the circuit section 222, also illustrated in FIG. 2 with an expanded view of the circuit section 222. Note that the partitioning process performed to form the partitioned circuit design 220 may result in circuit polygons, components, unit cells, or other circuit design elements being split into multiple different circuit sections. Such splitting may occur when partitioning parameters are specified independent of or without consideration for the underlying design hierarchy or repeating circuit components included in the circuit design 210.

To elaborate further, a layer of a memory circuit may include multiple repeating circuit design elements (e.g. unit cells of repeating circuit elements, such as a bit storage element). The duplicate section processing engine 110 need not previously analyze the memory circuit to determine an ideal partitioning scheme that evenly divides the circuit sections such that a single or multiple memory unit cells are included in individual circuit sections or that circuit section boundaries align exactly along memory unit cell boundaries. While such a partitioning may yield efficiency improvements in terms of reusing OPC processing results (or other EDA processing), the time and computing resources needed to determine an exact partitioning scheme to directly align circuit section boundaries with repeated unit cells in a circuit design may be time-consuming and increase execution latency, especially when hierarchical data in such circuit designs has been removed during a circuit flattening process.

On the other hand, the duplicate section technology described herein may provide "tuning-free" efficiency benefits with any type of partitioning parameters, whether such parameters are tuned to align circuit sections with repeating circuit design elements or not tuned at all. Characterization or evaluation of individual circuit sections may allow the duplicate section technology described herein to identify duplicate circuit sections regardless of how a circuit design is partitioned. Thus, for flattened circuit designs without separately or expressly stored hierarchy data, the duplicate section technology may nonetheless support duplicate section identification and processing of such duplicate circuit sections with increased efficiency.

The duplicate section processing engine 110 may identify any circuit sections among the partitioned circuit design 220 that are duplicates of one another (also referred to herein as identical to one another). Through duplicate section determinations, the duplicate section processing engine 110 may group any duplicate circuit sections together into identical section sets. Each identical section set determined by the duplicate section processing engine 110 may include specific circuit sections in the partitioned circuit design 220 that are determined to be identical to one another. In FIG. 2, an example of an identical section set is shown as the identical section set 240, which includes the circuit section 222. Each of the other circuit sections included in the identical section set 240 may be a duplicate of (or otherwise identical to) the circuit section 222, as determined by the duplicate section processing engine 110.

Duplicate circuit sections may be ascertained by the duplicate section processing engine 110 according to any number of duplicate criteria, such as the duplicate criteria 230 shown in FIG. 2. The duplicate criteria 230 may specify any condition that circuit sections need to satisfy with respect to one another in order for the duplicate section processing engine 110 to determine the circuit sections as duplicates of another. As such, circuit sections in the same identical section set may satisfy the duplicate criteria 230 with respect to one another, and the circuit section 222 shown in FIG. 2 may satisfy the duplicate criteria 230 with respect to other circuit sections in the identical section set 240.

The duplicate criteria 230 may specify different thresholds or tolerances required for duplicate section determinations, which may vary based on the specific EDA process, flow, or capability applied to the circuit design 210. For OPC processing, as one example, the duplicate criteria 230 may require that the layout of circuit sections be completely identical in order to satisfy the duplicate criteria 230. Completely identical circuit sections may require, in some examples, a 100% match in polygon layout and positioning between circuit sections. In other examples, fuzzy matching, threshold similarities (e.g., 95+% similarity), difference tolerances, or other criteria may be specified for duplicate section determinations that require less than completely identical layouts.

To determine duplicate circuit sections among the partitioned circuit design 220, the duplicate section processing engine 110 may evaluate or characterize individual circuit sections, or otherwise compare circuit sections. The type of circuit section evaluation, characterization, or comparison applied by the duplicate section processing engine 110 may vary based on the duplicate criteria 230, or vice versa. For example, the duplicate section processing engine 110 may perform pattern-matching between the polygon layouts of different circuit sections, and the duplicate criteria 230 may require a 99+% (or other any other configurable threshold) similarity output of the pattern matching process in order to identify circuit sections as duplicates of one another. As another example, the duplicate section processing engine 110 may overlay circuit sections on top of one another and determine duplicate sections when there is 100% overlap, e.g., an XOR output of overlayed circuit sections returns entirely '0' values for each pixel-by-pixel XOR comparison. Such image overlay XOR comparisons may be performed by the duplicate section processing engine 110 between pairs of circuit sections, and the duplicate criteria 230 may be specified according to a threshold percentage required to determine circuit sections as duplicates of one another.

In some implementations, the duplicate section processing engine 110 need not compare circuit sections in a pairwise manner in order to identify duplicate circuit sections and form identical section sets for a partitioned circuit design. For instance, the duplicate section processing engine 110 may characterize or evaluate each circuit section individually, and circuit sections with a matching characterization value may be deemed as duplicates according to the duplicate criteria 230. The duplicate section processing engine 110 may leverage the flattened nature of circuit sections in a partitioned circuit design, for example by computing characterizations for individual circuit sections based on polygon layouts of the flattened circuit sections. One example of such characterization that the duplicate section processing engine 110 may apply is polygon hashing. Polygon hashing, as used herein, may refer to any function by which the duplicate section processing engine 110 generates a characterization value (or set of values) for a given circuit section based on any aspect of the polygons included in the circuit section. Such a characterization value may be in the form of a hash value computed as a function of specific features, parameter values, or polygon attributes extracted from polygons in the given circuit section.

Example polygon hashing features according to the present disclosure are described in greater detail next with reference to FIG. 3.

Figure 3:
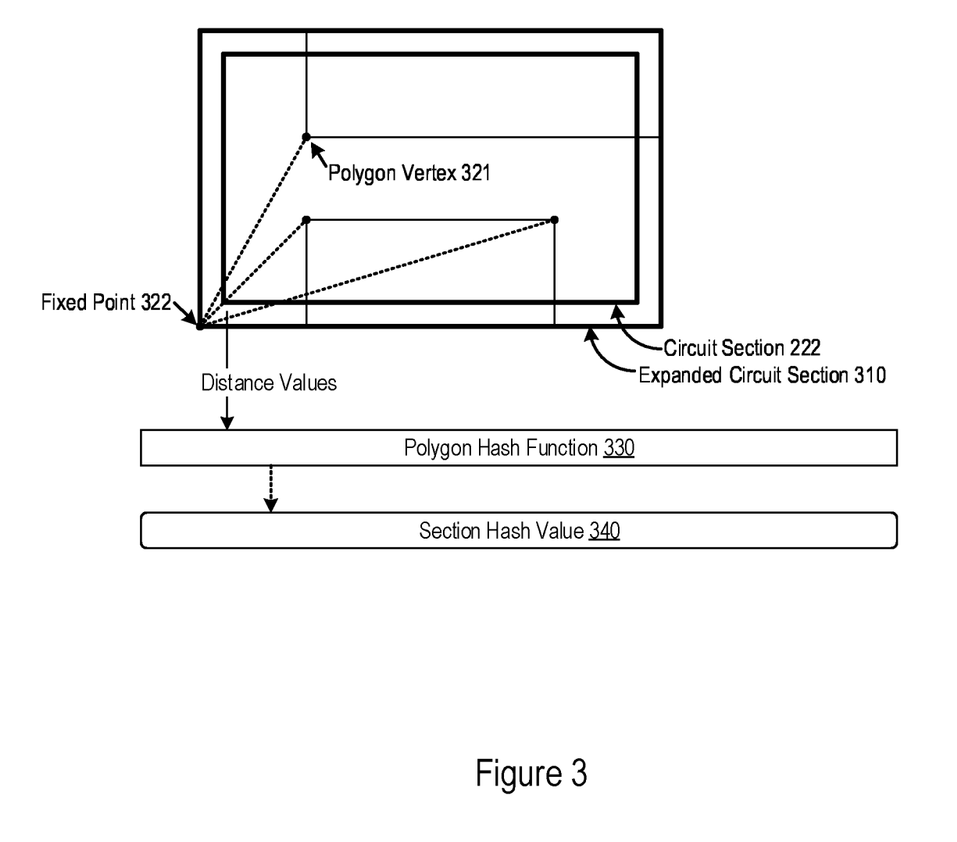
FIG. 3 shows an example of polygon hashing that a duplicate section processing engine may perform to characterize circuit sections of a partitioned circuit design.

FIG. 3 shows an example of polygon hashing that the duplicate section processing engine 110 may perform to characterize circuit sections of a partitioned circuit design. The example of polygon hashing in FIG. 3 is described using a section hash value as an example characterization value for a given circuit section. In determining identical section sets for a partitioned circuit design, the duplicate section processing engine 110 may, for the given circuit section, compute a section hash value as a function of polygons included in the given circuit section (or, understood another way, the polygon layout of the given circuit section). Computed section hash values may be used in duplicate section determinations, and duplicate criteria may be satisfied for circuit sections that have section hash values that are equal to another (or within a difference tolerance). In FIG. 3, the duplicate section processing engine 110 computes a section hash value for the circuit section 222, which may one of multiple circuit sections of the partitioned circuit design 220 described for FIG. 2.

In computing a section hash value, the duplicate section processing engine 110 may extract any number of polygon or layout features for a given circuit section. Example features include polygon vertex locations or coordinates, whether global coordinates or local coordinates (e.g., relative to a fixed point of the circuit section), distance values between the polygon vertices and a fixed point, a number of polygons in the circuit section, polygon area or perimeter values, polygon layout bitmaps, or any other characteristic, attribute, or aspect of any polygons located in the given circuit section.

In some implementations, the duplicate section processing engine 110 may account for an expanded region beyond the boundaries of a given circuit section to characterize the given circuit section. Such an expanded consideration may be applicable for OPC processing in particular, as neighboring circuit elements may impact OPC results and two circuit sections with identical layouts may yield different OPC processing results when neighboring circuit elements differ between the two circuit sections. This may be especially relevant for circuit sections proximate to IC boundaries (e.g., the physical boundary of the circuit itself), as OPC processing and OPC results for such circuit sections may be different than OPC results obtained for otherwise identical circuit sections further from the IC boundaries. As such, for the given circuit section, the duplicate section processing engine 110 may compute a section hash value as a function of any number of polygon attributes of an expanded circuit section with dimensions extended beyond dimensions of the given circuit section. An example of an expanded circuit section is shown in FIG. 3 as the expanded circuit section 310 with boundaries that extend beyond the boundaries of the circuit section 222.

As noted herein, the duplicate section processing engine 110 may extract polygon and layout features relative to a fixed point in a circuit section or expanded circuit section. In the example of FIG. 3, the duplicate section processing engine 110 extracts distances values between polygon vertices in the circuit section 222 or the expanded circuit section 310 (such as the polygon vertex 321 in FIG. 3) and a fixed point 322. The fixed point 322 may be selected by the duplicate section processing engine 110, for example by default as the bottom-left corner point of the expanded circuit section 310. Other example fixed points may include any fixed point (e.g., corner) in the circuit section 222 or the expanded circuit section 310. In the example of FIG. 3, the duplicate section processing engine 110 extracts distance values between the fixed point 322 and each of the polygon vertices included in the circuit section 222 (or expanded circuit section 310). Distance extractions may be performed by the duplicate section processing engine 110 through Euclidean distance computations between coordinates of the fixed point 322 and each polygon vertex of the expanded circuit section 310.

While some example polygon and layout features are provided herein, the duplicate section technology of the present disclosure contemplates that any polygon or layout feature can be used to characterize or evaluate a given circuit section, whether in addition or as an alternative to the various polygon and layout features described for FIG. 3.

The duplicate section processing engine 110 may provide any extracted polygon or layout features as inputs to a polygon hash function 330. The polygon hash function 330 may provide any hashing type of capability to generate a unique output value for unique input values. As such, the polygon hash function 330 may implement any number or type of hashing techniques to generate unique section hash values for input polygon or layout features extracted for a given circuit section. In some instances, the duplicate section processing engine 110 itself implements the polygon hash function 330. In the example of FIG. 3, the duplicate section processing engine 110 generates the section hash value 340 via the polygon hash function 330. The section hash value 340 may characterize the circuit section 222, and do so based on polygon and layout features extracted from the expanded circuit section 310 to account for the impact of neighboring circuit elements, as relevant for OPC processing.

In any manner described herein, the duplicate section processing engine 110 may characterize circuit sections through polygon hashing. Polygon hashing may provide an efficient mechanism to evaluate or characterize partitioned circuit sections, especially for flattened circuit sections in which polygon layouts are readily available from the flattening (as opposed to hierarchical circuit designs in which an actual layout of a circuit section can require express instantiation of hierarchical circuit elements that can be embedded with multiple hierarchy levels of design elements). Moreover, with polygon hashing, the duplicate section processing engine 110 need not perform complex pairwise comparisons between different circuit sections of a partitioned circuit design.

Instead, the duplicate section processing engine 110 may compute a section hash value for each individual circuit section, and group circuit sections with equal section hash values (or within a threshold difference between section hash values) into the same identical section set. To the extent comparison between circuit sections is necessary to determine identical section sets, the duplicate section processing engine 110 need only to compare the section hash values (e.g., integers or numerical values) instead of comparing or evaluating polygon layouts, geometry, or image patterns between the two circuit sections. Such numerical comparisons may allow the duplicate section processing engine 110 to determine identical section sets for a partitioned circuit design with increased speed and efficiency.

Accordingly, the duplicate section processing engine 110 may identify duplicate circuit sections within a partitioned circuit design. Duplicate circuit sections that satisfy duplicate criteria with respect to one another may be grouped into identical section sets. While some of the examples described herein refer to a particular identical section set of a partitioned circuit design, the duplicate section processing engine 110 may determine any number of identical section sets for a partitioned circuit design. The duplicate section processing engine 110 may also identify any unique circuit sections in a partitioned circuit design, and unique circuit sections may refer to any circuit section that does not satisfy the duplicate criteria with respect to every other circuit section of the partitioned circuit design. Or, a unique circuit section may be any circuit section for which a given identical section set includes only the unique circuit section and no other circuit sections of the partitioned circuit design.

Processing of a circuit design may be performed based on the identical section sets and unique circuit sections determined by the duplicate section processing engine 110. For unique circuit sections, the duplicate section processing engine 110 may perform an EDA process on the unique circuit section, and the EDA processing result for the unique circuit section may not be applicable to any other circuit section of a circuit design. For identical section sets that include multiple circuit sections, the duplicate section processing engine 110 may select a representative circuit section from each identical section set and apply processing results obtained for the representative circuit section unto other circuit sections in the same identical section set as the representative circuit section. Application of OPC results (or any EDA processing) may thus be imputed or attributed to other circuit sections, and done so without performing the OPC processing for each individual circuit section of a partitioned circuit design. Such application or imputation of OPC (or other EDA) results may increase the computational efficiency and reduce execution latencies for EDA computing systems. Application of EDA processing results to other circuit sections is discussed in greater detail next with reference to FIG. 4, using OPC results as an example.

Figure 4:
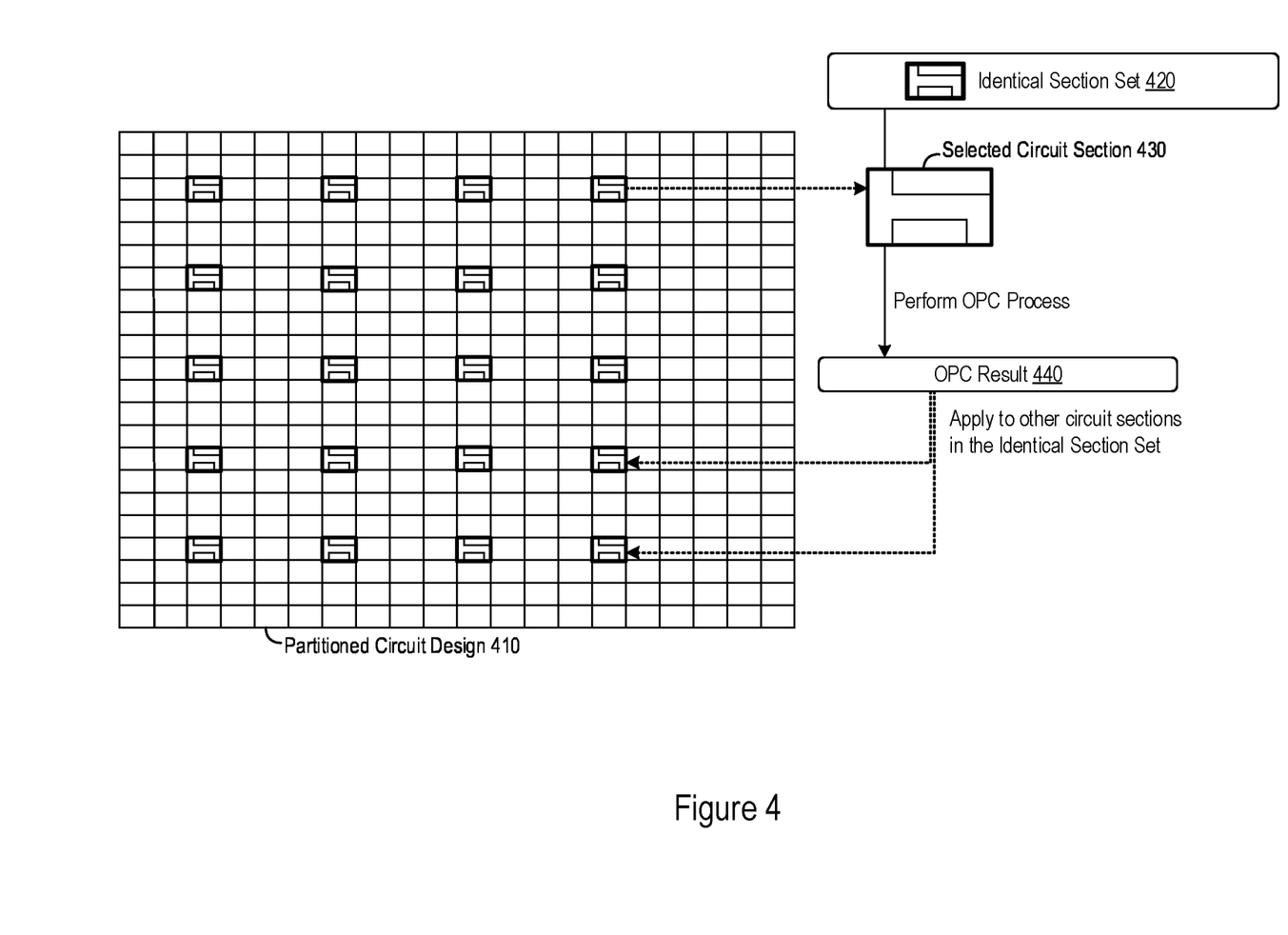
FIG. 4 shows an example application of OPC results to other circuit sections of an identical section set.

FIG. 4 shows an example application of OPC results to other circuit sections of an identical section set. A partitioned circuit design 410 is shown in FIG. 4 from which the duplicate section processing engine 110 may determine identical section sets. One such identical section set is shown in FIG. 4 as the identical section set 420, and the duplicate section processing engine 110 may determine that the sixteen (16) illustrated circuit sections in FIG. 4 satisfy duplicate criteria with respect to one another, and group the illustrated circuit sections into the identical section set 420. Note that for visual clarity, the polygon layouts of only these sixteen (16) circuit sections of the identical section set 420 are illustrated in FIG. 4. The polygon layouts of the remaining circuit sections in the partitioned circuit design 410 are not depicted in FIG. 4, though they too may be grouped into other identical section sets by the duplicate section processing engine 110 according to the duplicate criteria.

The duplicate section processing engine 110 may identify a representative circuit section from an identical section set and perform any sort of EDA processing on the representative circuit section. In FIG. 4, the duplicate section processing engine 110 selects the selected circuit section 430 from the identical section set 420, and representative circuit section selections may be performed randomly or based on any number of selection parameters. For duplicate criteria that require complete duplicates or 100% identically matching layouts, selection of any circuit section in the identical section set 420 may suffice, as each of the circuit sections in the identical section set 420 may be completely identical to one another (at least with respect to the duplicate criteria). For duplicate criteria that include tolerances for differences between circuit sections, the duplicate section processing engine 110 may select a representative circuit section according to any number of selection parameters or criteria, e.g., closest in pattern-matching or image comparison to a reference pattern or image, from a specific region, location, or portion of a circuit design, or according to any other selection criteria.

Upon determination of a representative circuit section, the duplicate section processing engine 110 may perform any EDA process or capability on the representative circuit section and apply the result to other circuit sections in the same identical section set as the representative circuit section. To illustrate through FIG. 4, the duplicate section processing engine 110 performs an OPC process on the selected circuit section 430 to obtain an OPC result 440, and applies the OPC result 440 to the other fifteen (15) circuit sections in the identical section set 420. OPC processes and results may include geometry processing or lithography simulations, and the duplicate section processing engine 110 need not perform, for example, a lithography simulation on each of the sixteen (16) circuit sections in the identical section set 420. Instead, the duplicate section processing engine 110 may perform the lithography simulation once (for the representative circuit section) and propagate the simulation results to the other circuit sections of the identical section set 420. As such, the number of times the OPC simulation is performed can be reduced, and duplicate section technology described herein may reduce execution latencies of OPC and other EDA processes and increase the computing speed of EDA computing systems in performing such EDA processes.

Note that the duplicate section technology described herein need not rely on unit cell designs and hierarchy data in achieving efficiency increases for EDA process executions. For instance, in FIG. 4, none of the circuit sections of the identical section set 420 are adjacent to one another in the partitioned circuit design 410. That is, the partitioning and duplicate circuit section determinations of the duplicate section technology described herein need not rely on partitioning of circuit sections directly, neatly, or completely aligned with unit cell designs or repeating hierarchical circuit elements. Instead, the duplicate section technology described herein can yield performance increases regardless of how a circuit design is partitioned, whether accounting for the repeating design patterns of unit cell or hierarchical cell patterning, or not.

This may be the case as the duplicate section processing engine 110 can identify duplicate circuit sections through independent characterization of the circuit sections, e.g., via polygon hashing of the polygon layout of the circuit section itself. As such, computational and time resources required to tune partitioning parameters to directly align partitioned circuit sections with unit cells need not be expended. Instead, the duplicate section processing engine 110 may partition a circuit design into multiple circuit sections with predetermined dimensions, and the predetermined dimensions can be specified (e.g., via user input) independent of unit cell dimensions for any unit cells in the circuit design. Indeed, circuit sections in a partitioned circuit design according to the present disclosure may split unit cells into multiple different circuit sections. A circuit section of an identical section set (e.g., the selected circuit section 430) may include portions of multiple unit cells in the circuit design, and other circuit sections may include other portions of the same unit cells split across different identical section sets.

Such partitioning may nonetheless result in identical circuit sections in a partitioned circuit design, especially for highly-repetitive circuits such as memory circuits. Thus, even though partitioned circuit designs may not directly align with unit cell boundaries, duplicate sections in repetitive memory circuit designs may nonetheless be present in partitioned circuit designs, which the duplicate section technology is capable of identifying to increase performance efficiencies. As noted herein, such identification of duplicate sections (even with unit cells split across multiple circuit sections) may be possible due to the characterization of individual circuit sections independent of hierarchy data or unit cell data, for example through polygon hashing. Such tuning-free benefits of the duplicate section technology may result in improved computing latencies and execution speed of EDA systems, and can yield such benefits out-of-the-box without pre-tuning, and may further do so for any type of input circuit design.

While many of the features described herein are provided using OPC processes as an example EDA process, the disclosure is not so limited. The duplicate section technology described herein may be consistently applied to any capability, process, or feature of an EDA application or EDA design flow, including with varying degrees of duplicate criteria and difference tolerances in duplicate section determinations.

Figure 5:
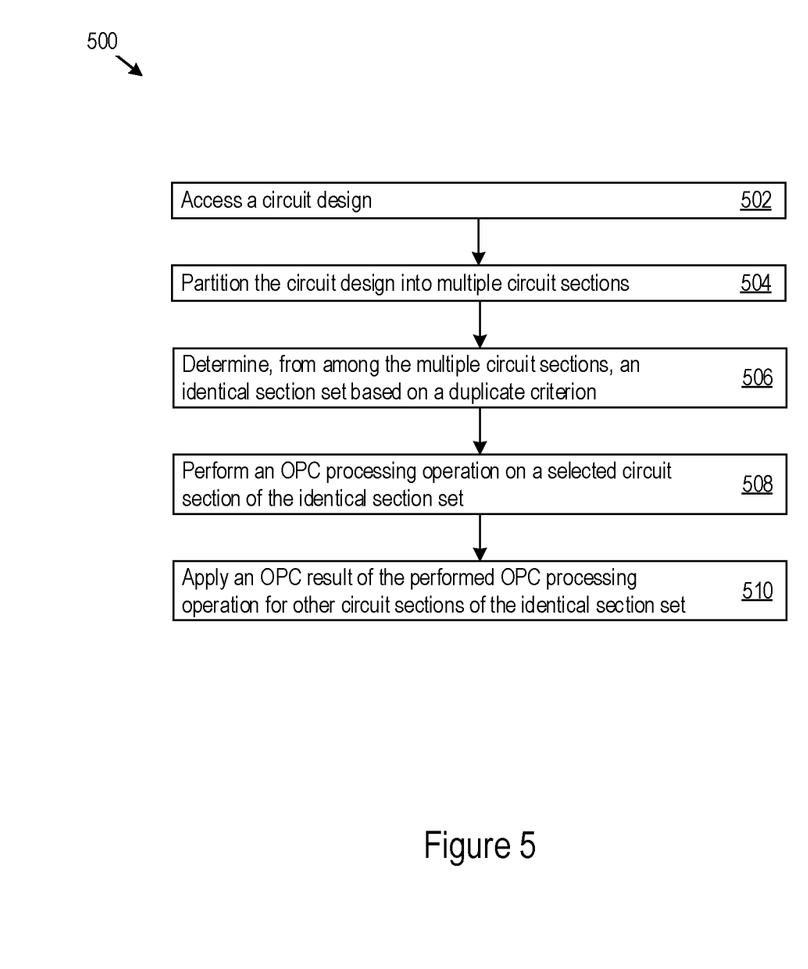
FIG. 5 shows an example of logic that a computing system may implement to support duplicate circuit section identification and processing for optical proximity correction OPC processes in EDA applications.

FIG. 5 shows an example of logic 500 that a computing system may implement to support duplicate circuit section identification and processing for optical proximity correction OPC processes in EDA applications. In some examples, the computing system 100 may implement the logic 500 as hardware, executable instructions stored on a machine-readable medium, or as a combination of both. The computing system 100 may implement the logic 500 via the circuit design access engine 108 and the duplicate section processing engine 110, for example, through which the computing system 100 may perform or execute the logic 500 as a method to support duplicate circuit section identification and processing for optical proximity correction OPC processes in EDA applications. The following description of the logic 500 is provided using the circuit design access engine 108 and the duplicate section processing engine 110 as an implementation example. However, various other implementation options by a system are possible.

In implementing the logic 500, the circuit design access engine 108 may access a circuit design (502). In implementing the logic 500, the duplicate section processing engine 110 may partition the circuit design into multiple circuit sections (504) and determine, from among the multiple circuit sections, an identical section set based on a duplicate criterion (506). Circuit sections of the identical section set may satisfy the duplicate criteria with respect to one another. In implementing the logic 500, the duplicate section processing engine 110 may further perform an OPC processing operation on a selected circuit section of the identical section set (508) and apply an OPC result of the performed OPC processing operation for other circuit sections of the identical section set (510), for example doing so instead of performing the OPC processing operation on the other circuit sections of the identical section set.

While example duplicate section features are shown and described through FIG. 5, the logic 500 may include any number of additional or alternative steps as well. The logic 500 may additionally or alternatively implement any other duplicate section features described herein, for example any with respect to the duplicate section processing engine 110.

Figure 6:
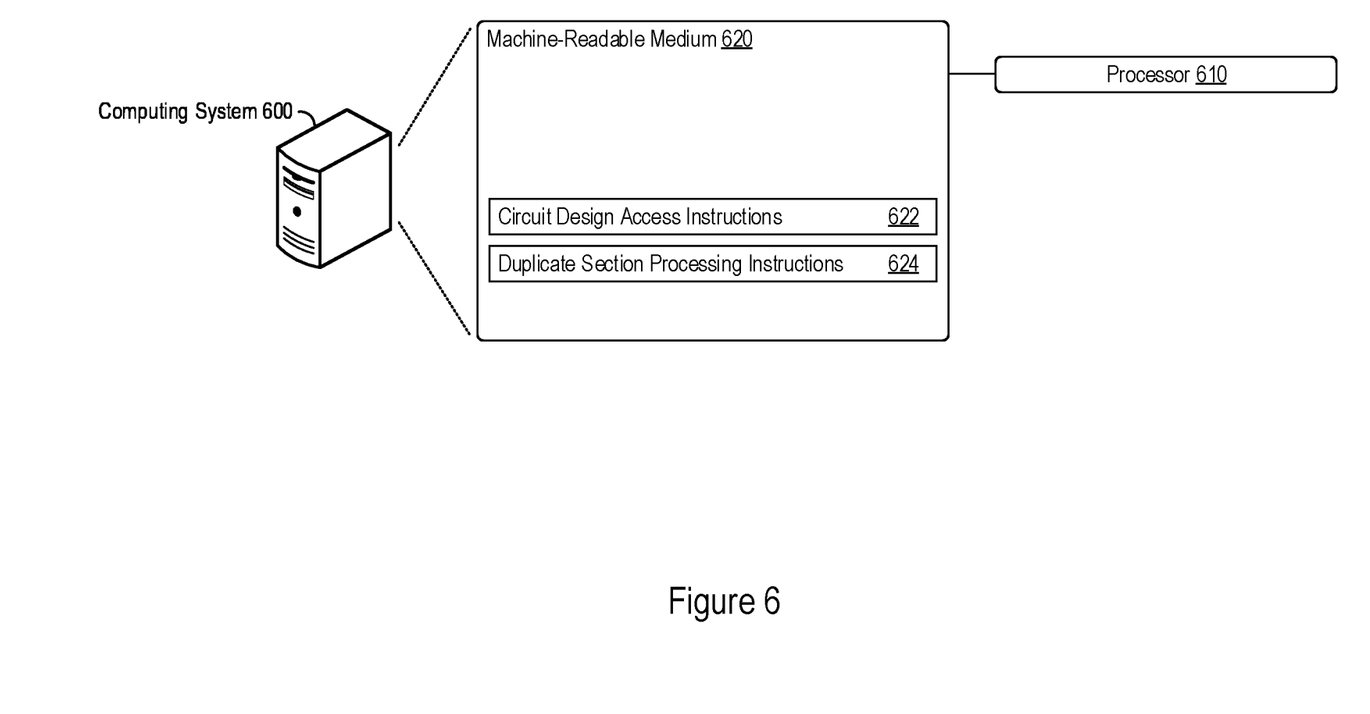
FIG. 6 shows an example of a computing system that supports duplicate circuit section identification and processing for optical proximity correction OPC processes in EDA applications.

FIG. 6 shows an example of a computing system 600 that supports duplicate circuit section identification and processing for optical proximity correction OPC processes in EDA applications. The computing system 600 may include a processor 610, which may take the form of a single or multiple processors. The processor(s) 610 may be a CPU of the computing system 600 and may include processing hardware, microprocessor, or any hardware device suitable for executing instructions stored on a machine-readable medium.

The computing system 600 may include a machine-readable medium 620. The machine-readable medium 620 may take the form of any non-transitory electronic, magnetic, optical, or other physical storage device that stores executable instructions, such as the circuit design access instructions 622 and the duplicate section processing instructions 624 shown in FIG. 6. As such, the machine-readable medium 620 may be, for example, random access memory (RAM) such as a dynamic RAM (DRAM), flash memory, spin-transfer torque memory, an electrically-erasable programmable read-only memory (EEPROM), a storage drive, an optical disk, and the like.

The computing system 600 may execute instructions stored on the machine-readable medium 620 through the processor 610. Executing the instructions may cause the computing system 600 to perform any of the duplicate section features described herein, including according to any of the features of the circuit design access engine 108, the duplicate section processing engine 110, or combinations of both. For example, execution of the circuit design access instructions 622 by the processor 610 may cause the computing system 600 to access a circuit design (e.g., the physical layout of a layer of an IC). Execution of the duplicate section processing instructions 624 by the processor 610 may cause the computing system 600 to partition the circuit design into multiple circuit sections and determine, from among the multiple circuit sections, an identical section set based on duplicate criteria. Circuit sections of the identical section set may satisfy the duplicate criteria with respect to one another. Execution of the duplicate section processing instructions 624 may further cause the computing system 600 to perform an EDA processing operation on a selected circuit section of the identical section set and apply an EDA result of the performed OPC processing operation for other circuit sections of the identical section set, doing so instead of (e.g., without) performing the EDA processing operation on the other circuit sections of the identical section set.

While some example features are described in FIG. 6, the circuit design access instructions 622, duplicate section processing engine 624, or a combination thereof, may implement any of the features of the duplicate section technology described herein.

The systems, methods, devices, and logic described above, including the circuit design access engine 108 and the duplicate section processing engine 110, may be implemented in many different ways in many different combinations of hardware, logic, circuitry, and executable instructions stored on a machine-readable medium. For example, the circuit design access engine 108, the duplicate section processing engine 110, or combinations thereof, may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. A product, such as a computer program product, may include a storage medium and machine readable instructions stored on the medium, which when executed in an endpoint, computer system, or other device, cause the device to perform operations according to any of the description above, including according to any features of the circuit design access engine 108, the duplicate section processing engine 110, or combinations thereof.

The processing capability of the systems, devices, and engines described herein, including the circuit design access engine 108 and the duplicate section processing engine 110, may be distributed among multiple system components, such as among multiple processors and memories, optionally including multiple distributed processing systems or cloud/network elements. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library (e.g., a shared library).

While various examples have been described above, many more implementations are possible.

The invention claimed is:

1. A method comprising:
by a computing system:
accessing a circuit design;
partitioning the circuit design into multiple circuit sections;
determining, from among the multiple circuit sections, an identical section set based on a duplicate criterion, wherein circuit sections of the identical section set satisfy the duplicate criterion with respect to one another;
performing an optical proximity correction (OPC) processing operation on a selected circuit section of the identical section set; and
applying an OPC result of the performed OPC processing operation for other circuit sections of the identical section set instead of performing the OPC processing operation on the other circuit sections of the identical section set.

2. The method of claim 1, wherein determining the identical section set comprises, for a given circuit section, computing a section hash value as a function of polygons included in the given circuit section; and
wherein the duplicate criterion is satisfied for circuit sections that have a same section hash value.

3. The method of claim 2, wherein determining the identical section set comprises, for the given circuit section, computing the section hash value as a function of polygons included in an expanded circuit section with dimensions extended beyond dimensions of the given circuit section.

4. The method of claim 3, wherein computing the section hash value comprises hashing distance values of polygon vertices from a fixed point in the given circuit section or the expanded circuit section.

5. The method of claim 1, wherein none of the circuit sections of the identical section set are adjacent to one another in the circuit design.

6. The method of claim 1, comprising partitioning the circuit design in multiple circuit sections with predetermined dimensions, wherein the predetermined dimensions are specified independent of unit cell dimensions for any unit cells in the circuit design.

7. The method of claim 1, wherein the selected circuit section includes portions of multiple unit cells in the circuit design.

8. A system comprising:
a circuit design access engine configured to access a circuit design; and
a duplicate section processing engine configured to:
partition the circuit design into multiple circuit sections;
determine, from among the multiple circuit sections, an identical section set based on a duplicate criterion, wherein circuit sections of the identical section set satisfy the duplicate criterion with respect to one another;
perform an optical proximity correction (OPC) processing operation on a selected circuit section of the identical section set; and
apply an OPC result of the performed OPC processing operation for other circuit sections of the identical section set without performing the OPC processing operation on the other circuit sections of the identical section set.

9. The system of claim 8, wherein the duplicate section processing engine is configured to determine the identical section set by, for a given circuit section, computing a section hash value as a function of polygons included in the given circuit section; and
wherein the duplicate criterion is satisfied for circuit sections that have a same section hash value.

10. The system of claim 9, wherein the duplicate section processing engine is configured to determine the identical section set by, for the given circuit section, computing the section hash value as a function of polygons included in an expanded circuit section with dimensions extended beyond dimensions of the given circuit section.

11. The system of claim 10, wherein the duplicate section processing engine is configured to compute the section hash value by hashing distance values of polygon vertices from a fixed point in the given circuit section or the expanded circuit section.

12. The system of claim 8, wherein none of the circuit sections of the identical section set are adjacent to one another in the circuit design.

13. The system of claim 8, wherein the duplicate section processing engine is configured to partition the circuit design in multiple circuit sections with predetermined dimensions, wherein the predetermined dimensions are specified independent of unit cell dimensions for any unit cells in the circuit design.

14. The system of claim 8, wherein the selected circuit section includes portions of multiple unit cells in the circuit design.

15. A non-transitory machine-readable medium storing instructions that, when executed by a processor, cause a computing system to:
access a circuit design;
partition the circuit design into multiple circuit sections;
determine, from among the multiple circuit sections, an identical section set based on a duplicate criterion, wherein circuit sections of the identical section set satisfy the duplicate criterion with respect to one another;
perform an electronic design automation (EDA) processing operation on a selected circuit section of the identical section set; and
apply an EDA result of the performed EDA processing operation for other circuit sections of the identical section set without performing the EDA processing operation on the other circuit sections of the identical section set.

16. The non-transitory machine-readable medium of claim 15, wherein the instructions cause the computing system to determine the identical section set by, for the given circuit section, computing the section hash value as a function of polygons included in an expanded circuit section with dimensions extended beyond dimensions of the given circuit section.

17. The non-transitory machine-readable medium of claim 16, wherein the instructions cause the computing system to compute the section hash value by hashing distance values of polygon vertices from a fixed point in the given circuit section or the expanded circuit section.

18. The non-transitory machine-readable medium of claim 15, wherein none of the circuit sections of the identical section set are adjacent to one another in the circuit design.

19. The non-transitory machine-readable medium of claim 15, wherein the instructions cause the computing system to partition the circuit design in multiple circuit sections with predetermined dimensions, wherein the predetermined dimensions are specified independent of unit cell dimensions for any unit cells in the circuit design.

20. The non-transitory machine-readable medium of claim 15, wherein the selected circuit section includes portions of multiple unit cells in the circuit design.

* * * * *